United States Patent
Niimi et al.

(10) Patent No.: US 8,617,954 B2
(45) Date of Patent: Dec. 31, 2013

(54) FORMATION OF NITROGEN CONTAINING DIELECTRIC LAYERS HAVING AN IMPROVED NITROGEN DISTRIBUTION

(75) Inventors: Hiroaki Niimi, Dallas, TX (US); Manoj Mehrotra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 380 days.

(21) Appl. No.: 11/856,310

(22) Filed: Oct. 9, 2007

(65) Prior Publication Data
US 2009/0090990 A1  Apr. 9, 2009

(51) Int. Cl.
*H01L 21/8234* (2006.01)
(52) U.S. Cl.
USPC ............ 438/275; 438/287; 257/E21.625; 257/E21.639
(58) Field of Classification Search
USPC ......... 438/275, 283, 287, 775, 778, 981, 216; 257/E21.192, E21.302, E21.625, 257/E21.639
See application file for complete search history.

(56) References Cited

U.S. PATENT DOCUMENTS

| | | | | |
|---|---|---|---|---|
| 5,296,393 | A * | 3/1994 | Smayling et al. | 438/275 |
| 5,952,706 | A * | 9/1999 | Bashir | 257/587 |
| 6,667,200 | B2 | 12/2003 | Sohn et al. | |
| 6,706,577 | B1 * | 3/2004 | Twu et al. | 438/199 |
| 6,730,566 | B2 * | 5/2004 | Niimi et al. | 438/275 |
| 7,183,165 | B2 | 2/2007 | Khamankar et al. | |
| 7,274,076 | B2 * | 9/2007 | Williford | 257/402 |
| 7,462,520 | B2 * | 12/2008 | Park et al. | 438/151 |
| 7,563,726 | B2 * | 7/2009 | Cho et al. | 438/769 |
| 2002/0190268 | A1 | 12/2002 | Wang | |
| 2003/0001212 | A1 * | 1/2003 | Hu et al. | 257/388 |
| 2004/0262701 | A1 * | 12/2004 | Alshareef et al. | 257/410 |
| 2007/0066021 | A1 * | 3/2007 | Niimi et al. | 438/287 |
| 2007/0082506 | A1 * | 4/2007 | Wang et al. | 438/778 |

* cited by examiner

*Primary Examiner* — David Vu
(74) *Attorney, Agent, or Firm* — Warren L. Franz; Wade J. Brady, III; Frederick J. Telecky, Jr.

(57) ABSTRACT

Provided is a method for manufacturing a gate dielectric. This method, without limitation, includes subjecting a silicon substrate to a first plasma nitridation process to incorporate a nitrogen region therein. This method further includes growing a dielectric material layer over the nitrogen region using a nitrogen containing oxidizer gas, and subjecting the dielectric material layer to a second plasma nitridation process, thereby forming a nitrided dielectric material layer over the nitrogen region.

12 Claims, 6 Drawing Sheets

FORMATION OF NITROGEN CONTAINING DIELECTRIC LAYERS HAVING AN IMPROVED NITROGEN DISTRIBUTION

TECHNICAL FIELD

The present disclosure is directed, in general, to a method for manufacturing gate dielectric layers and, more specifically, to the formation of nitrided gate dielectric layers having an improved nitrogen distribution.

BACKGROUND

In certain semiconductor applications it is necessary to integrate dual gate oxide (DGO) thicknesses for associated transistor devices onto a single integrated circuit device. One motivation for performing DGO processing is that high performance transistors typically operate at lower voltages (e.g., 1.5 volts and below), and thus require thinner gate dielectric regions. Alternatively, devices that interface with most conventional external peripherals typically require higher operating voltages (e.g., 1.6 volts and above), and thus require thicker gate dielectric regions. When interfacing lower voltage high performance metal-oxide-semiconductor field-effect-transistors (MOSFETs) within a core of an integrated circuit, to higher voltage peripheral devices, input and output (I/O) buffers of the integrated circuit (IC) are typically designed to contain thicker gate dielectric regions that are compatible with the higher external peripheral device voltages.

For example, current microcontroller units (MCUs) and digital signal processors (DSPs) are integrating several different types of technology onto a single IC, such as high speed logic, power logic, static random access memory (SRAM), nonvolatile memory (NVM), embedded dynamic random access memory (DRAM), analog circuitry, and other devices and technologies. Many of these devices require different gate dielectric processing and different gate dielectric thicknesses to provide both lower voltage devices within the core of the device and higher voltage devices to interface with external peripheral devices.

As stated above, a DGO thickness structure generally includes thin gate dielectrics for high performance low voltage operation core devices, and thick gate dielectrics for low leakage high voltage operation I/O devices. As devices shrink, and to meet device requirements, even the thick gate dielectrics are getting thinner. This can cause increased leakage current for the devices, especially the high voltage devices having the thick gate dielectrics.

It has generally been accepted that the leakage current can be mitigated by introducing nitrogen atoms into the gate dielectrics to suppress leakage currents for both the thin and thick gates. One method of nitrogen atom introduction includes performing non-thermal nitridation (e.g., plasma or radical nitridation) on the gate dielectrics. Unfortunately, this and other methods of introducing the nitrogen atoms into the gate dielectrics tend to provide a non-uniform nitrogen profile in the gate dielectric, which results in reduced reliability. The non-uniformity, and thus reduced reliability, is particularly significant in thicker gate dielectrics, such as those used in the aforementioned high voltage devices.

Figure 1:
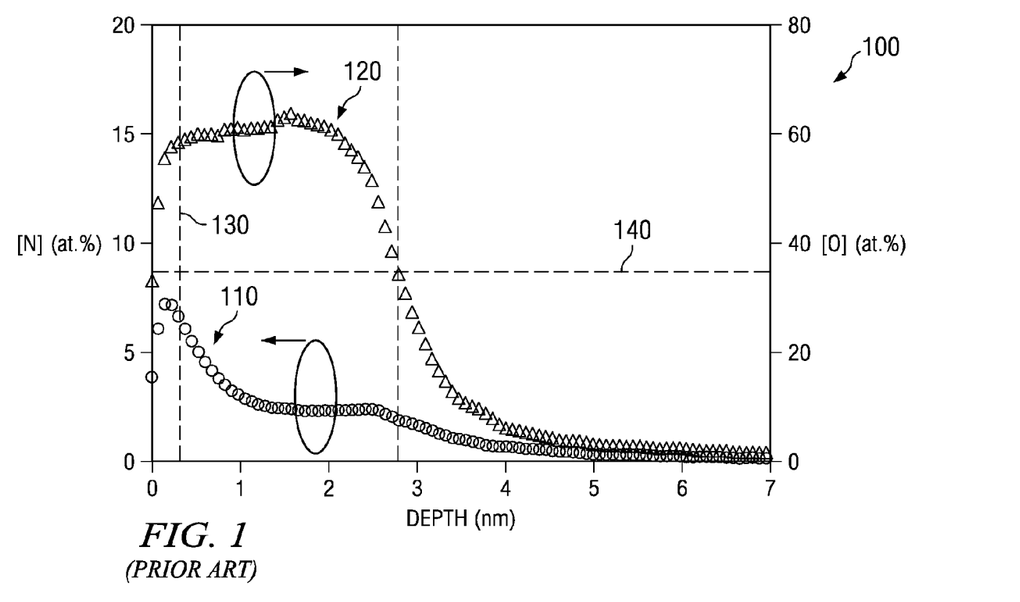
FIG. 1 (Prior Art) illustrates a graph depicting the non-uniformity of nitrogen within a dielectric layer manufactured using conventional techniques.

FIG. 1 depicts a graph 100 illustrating the nitrogen profile 110 and oxygen profile 120 in a gate dielectric manufactured using one of the aforementioned nitrogen inclusion techniques. In observing the nitrogen profile 110 in the gate dielectric layer, those skilled in the art understand focus should be made on the bulk region of the dielectric layer, wherein the nitrogen profile is a true representation of the dielectric layer. Accordingly, the bulk region of the dielectric layer is generally defined to exclude, on the lower limit, the first 0.3 nm of the dielectric layer, represented by the line 130, and exclude, on the upper limit, anything past where the oxygen profile 120 decreases to about 50% of an average oxygen concentration within the bulk region, as represented by a line 140.

A non-uniformity (N.U.) of the nitrogen concentration in the bulk region may be defined to quantify differences between films. The definition applied in the context of the present disclosure is $$\% \ N.U. = \frac{[N]_{max} - [N]_{min}}{[N]_{avg}} * 100 \quad (1)$$

Using this equation, the non-uniformity of the nitrogen within the dielectric layer represented in the graph 100 is at least 135 percent if not 140 percent or more. As indicated above, this non-uniformity introduces reliability issues. The graph 100 thereby illustrates that conventional manufacturing techniques are generally unable to obtain nitrogen non-uniformity values in the bulk of the dielectric layers less than about 100 percent.

Accordingly, what is needed in the art is a method for improving the nitrogen distribution within a dielectric layer.

SUMMARY

To address the above-discussed deficiencies, provided is a method for manufacturing a gate dielectric. This method, without limitation, includes subjecting a silicon substrate to a first plasma nitridation process to incorporate a nitrogen region therein. This method further includes growing a dielectric material layer over the nitrogen region using a nitrogen and oxygen containing fluid, and subjecting the dielectric material layer to a second plasma nitridation process, thereby forming a nitrided dielectric material layer over the nitrogen region.

Also provided is a method for manufacturing a semiconductor device. The method for manufacturing the semiconductor device, in one embodiment, includes: 1) providing a substrate having a high voltage device region and a lower voltage device region, 2) subjecting the high voltage device region to a first plasma nitridation process to incorporate a nitrogen region within the substrate, at least a portion of the low voltage device region being protected from the first plasma nitridation process using a protective layer, 3) forming a first dielectric material layer over the nitrogen region using a nitrogen and oxygen containing fluid, 4) forming a second dielectric material layer over the substrate in the lower voltage device region after removing the protective layer, 5) subjecting the first dielectric material layer and the second dielectric material layer to a second plasma nitridation process, thereby forming a first nitrided dielectric material layer in the high voltage device region and a second nitrided dielectric material layer in the lower voltage device region, 6) forming a gate electrode material layer over the first nitrided dielectric material layer and the second nitrided dielectric material layer, and 7) patterning the gate electrode material layer, first nitrided dielectric material layer and the second nitrided dielectric material layer into a first gate structure in the high voltage device region and a second gate structure in the lower voltage device region.

Additionally provided is a semiconductor device. The semiconductor device may include a substrate having a high voltage device region and a lower voltage device region. The semiconductor device may additionally include a first gate structure located over the high voltage device region, the first gate structure including a nitrogen region located within the substrate, a first nitrided gate dielectric layer, and a first gate electrode layer. In this embodiment a bulk portion of the first nitrided gate dielectric layer has a uniform nitrogen concentration above about 9 atomic percent. The semiconductor device may also include a second gate structure located over the lower voltage device region, the second gate structure including a second nitrided gate dielectric layer and a second gate electrode layer.

BRIEF DESCRIPTION OF THE DRAWINGS

For a more complete understanding of the disclosure, reference is now made to the following descriptions taken in conjunction with the accompanying drawings, in which.

DETAILED DESCRIPTION

Figure 2:
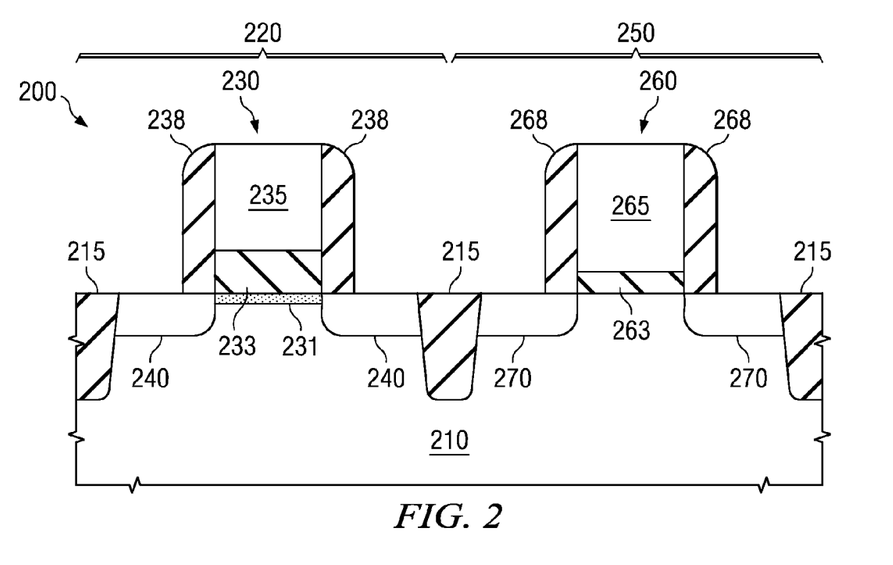
FIG. 2 illustrates a semiconductor device manufactured in accordance with the disclosure.

FIG. 2 illustrates a semiconductor device 200 manufactured in accordance with the disclosure. The device 200 initially includes a semiconductor substrate 210. The substrate 210, in the embodiment of FIG. 2, has isolation structures 215 located therein. The structures 215 may be any isolation structures used in semiconductor devices, including shallow trench isolation structures, field oxide isolation structures, etc.

As is illustrated in FIG. 2, the structures 215 divide the device 200 into first and second transistor device regions. More particularly in the embodiment of FIG. 2, the structures 215 divide the device 200 into a high voltage device region 220 and a lower voltage device region 250. The term "high voltage device region", as defined herein, means a device operating at voltages of about 1.6 volts and above. Additionally, the term "lower voltage device region", as defined herein, means a device operating at voltages of about 1.5 volts and below. Accordingly, the high voltage device region 220 might be configured to provide a low leakage input/output (I/O) device, wherein the lower voltage device region 250 might be configured to provide a high performance core device. It is to be appreciated that the single high and lower voltage device regions 220, 250, are provided for illustrative purposes, and that the device 200 may include a plurality of the high voltage device regions 220 and lower voltage device regions 250 without departing from the disclosure.

The high voltage device region 220 illustrated in FIG. 2 initially includes a gate structure 230. The gate structure 230 includes a thin nitrogen region 231 located within the substrate 210. The gate structure 230 additionally includes the nitrided gate dielectric layer 233. Because the gate structure 230 forms a part of what will ultimately be a high voltage structure, the gate dielectric layer 233 tends to comprise a thick gate dielectric. For example, the gate dielectric layer 233 in the high voltage device region 220 might have a thickness ranging from about 1.5 nm to about 3.5 nm, or greater. Nevertheless, other thicknesses outside this range could be used.

The nitrided gate dielectric layer 233 can be an oxide (e.g., silicon dioxide (SiO2)) or a dielectric material suitable for operating as a gate dielectric structure of a transistor device. Since the nitrided gate dielectric layer 233 is relatively thin in comparison to conventional thick gate dielectric layers, nitrogen atoms have been introduced into the gate dielectric layer 233, for example to suppress leakage currents associated with the operation of the gate structure 230. The nitrogen atoms can be introduced into the nitrided gate dielectric layer 233 using a number of different processes. However, in the embodiment of FIG. 2 the nitrogen atoms are introduced into the nitrided gate dielectric layer 233 using a plasma (e.g., radical) nitridation process. A nitrided gate dielectric, such as silicon oxynitride, may result after introducing the nitrogen atoms into the nitrided gate dielectric layer 233.

Figure 3:
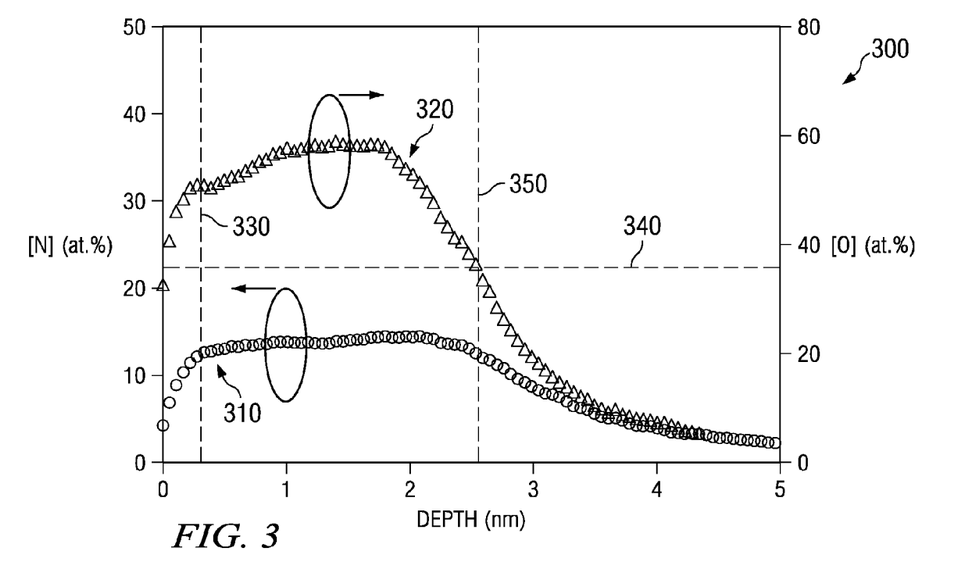
FIG. 3 illustrates a graph depicting the nitrogen concentration and oxygen concentration in a gate dielectric manufactured in accordance with the disclosure.

Turning for a moment to FIG. 3, shown is a graph 300 illustrating the nitrogen concentration and oxygen concentration in a gate dielectric manufactured in accordance with the principles of the disclosure. The gate dielectric is representative of the nitrided gate dielectric layer 233, and will be referred to as such in the discussion of the graph 300. A nitrogen profile 310, portrayed as circles, shows the measured concentration of nitrogen, [N], with increasing depth in the gate dielectric layer 233. An oxygen profile 320, portrayed as triangles, shows the measured concentration of oxygen, [O], with increasing depth in the gate dielectric layer 233. Both the nitrogen profile 310 and oxygen profile 320 were, in this embodiment, determined by time-of-flight secondary ion mass spectrometry (ToF-SIMS).

For purposes of this discussion, the nitrided gate dielectric layer 233 may be characterized as having a surface region and a bulk region. Each of the surface region and the bulk region may be defined in relation to the surface of the gate dielectric layer 233 and the oxygen profile 320. The surface region is defined to begin at the surface of the gate dielectric 233, and extend to a depth of about 0.3 nm, as indicated by a line 330. The bulk region extends from about 0.3 nm until the oxygen profile 320 decreases to about 50% of an average oxygen concentration within the bulk region, as indicated by a line 340. The depth corresponding to the intersection of the oxygen profile 320 and the line 340, as indicated by a line 350, is the lower extent of the bulk region, or about 2.5 nm in the graph 300. Those skilled in the art will appreciate that the thickness of the bulk region will depend on the total thickness of the gate dielectric layer 233.

A non-uniformity (N.U.) of the nitrogen concentration in the bulk region may be defined to quantify differences between films. The definition applied in the context of the present disclosure is $$\% \ N.U. = \frac{[N]_{max} - [N]_{min}}{[N]_{avg}} * 100 \qquad (2)$$

For the purposes of the disclosure, a non-uniformity less than about 35 percent is considered to be substantially uniform. Many of the conventional techniques for manufacturing the gate dielectrics provide a nitrogen non-uniformity of 100 percent or greater. Thus defined, the non-uniformity of the nitrogen concentration of the bulk region of the gate dielectric 233 in the graph 300 is computed to be less than about 20%, which is significantly below that which is generally attainable using conventional methods, and substantially below the upper level of what is considered uniform (e.g., 35 percent and above). Accordingly, the inventive methodology of the present disclosure is capable of providing gate dielectrics having substantially uniform nitrogen concentrations therein.

Not only does the gate dielectric layer 233 have a uniform nitrogen concentration, as defined above, the average uniform nitrogen concentration in certain embodiments is at or above about 9 atomic percent. For example, in the graph 300 of FIG. 3, the average uniform nitrogen concentration is at least about 12 atomic percent. This is in direct contrast to previous gate dielectrics, including some previous gate dielectrics that might have had a uniform nitrogen concentration, which would have had nitrogen concentrations of about 8 atomic percent or below. It is believed that this feature (e.g., the average uniform nitrogen concentration at or above 9 atomic percent) is unique to the method for manufacturing the gate dielectric disclosed herein.

Returning to FIG. 2, the gate structure 230 also includes a gate electrode layer 235 disposed over the nitrided gate dielectric layer 233. The gate electrode layer 235 may comprise, without limitation, polysilicon, amorphous silicon, germanium, silicon-germanium, or metal. Sidewall spacers 238 of a suitable insulating material may be disposed adjacent to the sidewalls of the nitrided gate dielectric layer 233 and gate electrode layer 235. Source/drain regions 240, which in one embodiment are conventional, may be formed within the substrate 210 proximate the gate structure 230.

The lower voltage device region 250 may include a second gate structure 260. As is illustrated in FIG. 2, the gate structure 260 may include a second nitrided gate dielectric layer 263 located over the substrate 210. Because the gate dielectric layer 263 forms a part of what will ultimately be a high performance lower voltage structure, the gate dielectric layer 263 tends to comprise a thinner gate dielectric. For example, the gate dielectric layer 263 in the lower voltage device region 250 could have a thickness ranging from about 0.8 nm to about 1.4 nm. Nevertheless, other thicknesses outside this range could be used.

The second gate dielectric layer 263 may also be an oxide (e.g., silicon dioxide ($SiO_2$)) or a dielectric material suitable for operating as a gate dielectric structure of a transistor device. In the embodiment of FIG. 2, nitrogen atoms have also been introduced into the gate dielectric layer 263 to suppress leakage currents associated with the operation of the gate structure 260. The nitrogen atoms can be introduced into gate dielectric 263 using a similar process as used to introduce the nitrogen atoms into the gate dielectric layer 233. A nitrided gate dielectric, such as silicon oxynitride, may also result after introducing the nitrogen atoms into the gate dielectric layer 263. As leakage is often more problematic for high voltage devices, certain embodiments of the present disclosure may exist wherein the gate dielectric layer 263 does not contain the nitrogen therein.

The gate structure 260 also includes a second gate electrode layer 265 disposed over the gate dielectric layer 263. The gate electrode 265 may comprise, without limitation, polysilicon, amorphous silicon, germanium, silicon-germanium or metal. Sidewall spacers 268 of a suitable insulating material may be disposed adjacent to the sidewalls of the gate dielectric layer 263 and gate electrode layer 265. Source/drain regions 270, in certain embodiments conventional, may also be formed within the substrate 210 proximate the gate structure 260.

While not illustrated, the source/drain regions 240 and 270 can also include source/drain extensions that are generally aligned with and partially beneath the respective edges of the gate electrode layers 235 and 265. Those skilled in the art will understand and appreciate that the high and lower voltage device regions 220, 250 can include either P type or N type transistors. The source/drain regions 240 and 270 can be formed as N or P type regions by doping with boron, arsenic or other appropriate doping materials, as known in the art.

FIGS. 4-11 illustrate how one skilled in the art might manufacture a semiconductor device in accordance with this disclosure. While FIGS. 4-11 are specifically directed to the manufacture of a semiconductor device, FIGS. 4-11 also illustrate, in a broad sense, how one skilled in the art might manufacture a gate dielectric with improved nitrogen uniformity in accordance with the disclosure. Thus, a method for manufacturing a gate dielectric is discussed within the confines of discussing how one skilled in the art might manufacture a semiconductor device with respect to FIGS. 4-11. Nevertheless, while each of these ideas is discussed and illustrated using a single set of drawings, neither should be limiting on the other.

Figure 4:
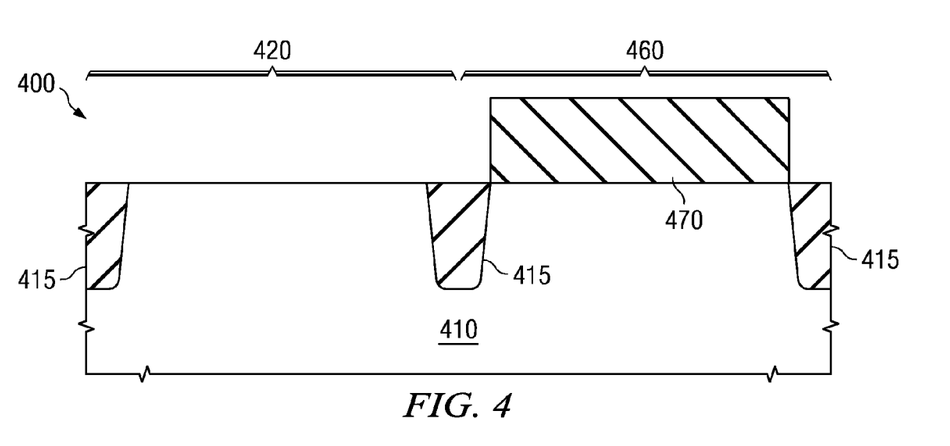
FIGS. 4-11 illustrate how one skilled in the art might manufacture a semiconductor device in accordance with this disclosure.

FIG. 4 illustrates a semiconductor device 400 at an initial stage of formation. The device 400 illustrated in FIG. 4 initially includes a substrate 410. The substrate 410 may, in an embodiment, be any layer located in the device 400, including a wafer itself or a layer located above the wafer (e.g., epitaxial layer). Moreover, the substrate 410 is generally formed from a semiconductor material, such as silicon or polysilicon. However, the substrate 410 may also be formed from other materials such as gallium arsenide, germanium, silicon-germanium, epitaxial formations, silicon carbide, indium phosphide, silicon-on-insulator substrates (SOI), strained silicon substrates, and/or other semiconductor substrate materials. Nevertheless, in the illustrative embodiment shown, the substrate 410 comprises an epitaxial silicon layer.

Formed within the substrate 410 and separating the device 400 into a high voltage device region 420 and a lower voltage device region 460 are isolation structures 415. The structures 415 illustrated in FIG. 4 happen to be shallow trench isolation structures; nevertheless, other embodiments exist wherein the isolation structures differ from those shown. For example, other known embodiments use field oxide isolation structures in place of the shallow trench isolation structures shown.

As just mentioned, the structures 415 in the embodiment of FIG. 4 separate the devices. The high voltage device region 420 might include transistor devices configured to operate at high voltages (e.g., about 1.6 volts and above) and the lower voltage device region 460 might include transistor devices configured to operate at lower voltages (e.g., about 1.5 volts and below).

The device 400 additionally includes a protective layer 470 exposing the high voltage device region 420 and protecting the lower voltage device region 460. The protective layer 470, in the embodiment shown, comprises an oxide. For example, an oxide having a thickness of at least about 10 nm may be formed (e.g., grown in one embodiment) on the substrate 410 and subsequently patterned to result in the protective layer 470. While an oxide is used in the embodiment of FIG. 4, other materials might also be used. Those skilled in the art understand the myriad of processes that might be used to form the protective layer 470, including the growth of the layer.

Figure 5:
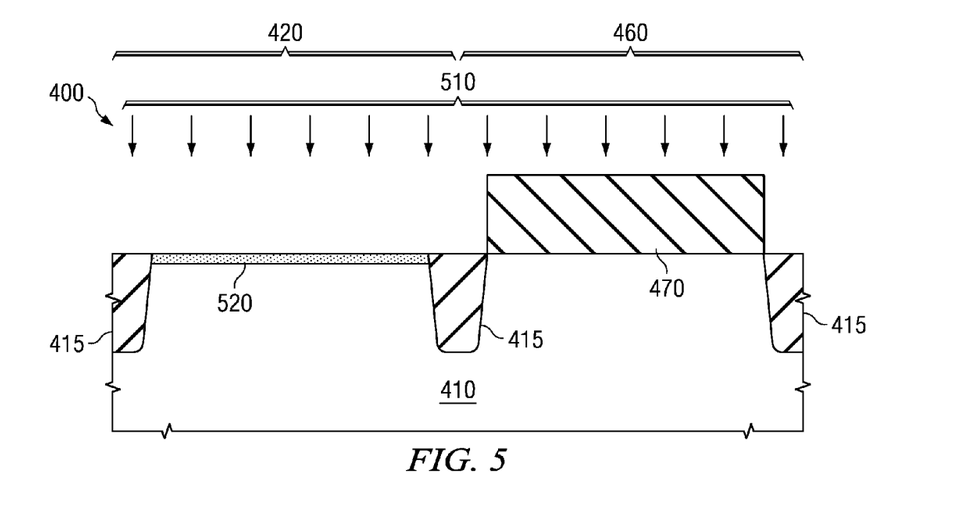

FIG. 5 illustrates the device 400 of FIG. 4 after subjecting it to a plasma (e.g., radical) nitridation process 510. As the protective layer 470 protects the lower voltage device region 460, the plasma nitridation process 510 forms a nitrogen region 520 within the substrate 410 in the high voltage device region 420. As one might expect, a small amount of nitrogen may reside in the upper surface of the layer 470 after conducting the process 510.

The specific conditions of the plasma nitridation process 510 may vary. However, one embodiment might use an effective RF power ranging from about 500 watts to about 1500 watts, a pressure ranging from about 10 mTorr to about 100 mTorr, a temperature ranging from about room temperature to about 200° C., a gas flow of nitrogen ranging from about 50 sccm to about 500 sccm, and for a period of about 30 seconds to about 90 seconds. However, another embodiment might use an effective microwave plasma power ranging from about 1000 watts to about 2000 watts, a pressure ranging from about 50 mTorr to about 200 mTorr, a temperature ranging from about 200° C. to about 500° C., a gas flow of nitrogen ranging from about 10 sccm to about 100 sccm, a gas flow of argon ranging from about 500 sccm to about 1500 sccm, and for a period of about 30 seconds to about 90 seconds. Nevertheless, other processing conditions could also be used.

Figure 11:
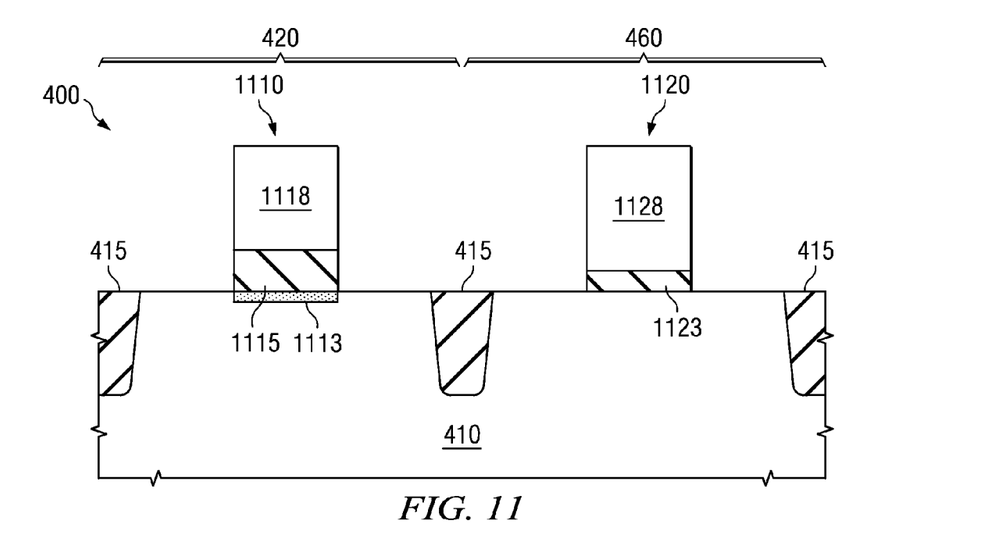

What results is the nitrogen region 520. The nitrogen region 520, in one embodiment, has an average nitrogen concentration of at least about $1 \times 10^{16}$ atoms/cm3, and in another embodiment from about $2 \times 10^{16}$ atoms/cm3 to about $5 \times 10^{16}$ atoms/cm3. As indicated above, the high nitrogen concentration of the nitrogen region 520 can be instrumental to the uniform nitrogen concentration that will ultimately result in the first nitrided gate dielectric layer 1115 (FIG. 11). For example, the nitrogen concentration of the nitrogen region 520 helps define the final nitrogen concentration in the first nitrided gate dielectric layer 1115. Nevertheless, other nitrogen concentrations outside of the above-disclosed ranges could also be used.

Figure 6:
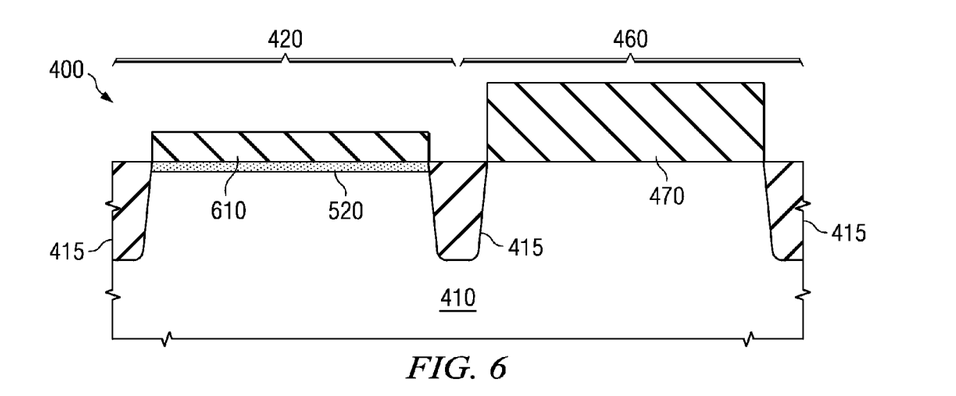

FIG. 6 illustrates the device 400 of FIG. 5 after forming a first dielectric material layer 610 over the nitrogen region 520 in the high voltage device region 420. In the embodiment of FIG. 6, the layer 610 does not form within the lower voltage device region 460 because the lower voltage device region 460 is being protected by the protective layer 470. The layer 610 may have a thickness ranging from about 1.5 nm to about 3.5 nm, among others, while remaining within the purview of the disclosure.

The layer 610 may be formed in many different ways; however, in the embodiment of FIG. 6, it is formed using a nitrogen containing oxidizer gas. For instance, in one embodiment the layer 610 might be grown using nitrous oxide (N2O) gas. In an alternative embodiment, the layer 610 might be grown using nitric oxide (NO) gas, or a mixture of the above gases with an inert gas. The inclusion of the nitrogen helps reduce the removal of any nitrogen from the interface of the layer 610 and the nitrogen region 520. In one example embodiment, the layer 610 is grown in the N2O ambient using the following processing conditions: a pressure ranging from about 5 Torr to about 500 Torr, a temperature ranging from about 1050° C. to about 1150° C., and for a period of about 30 seconds to about 90 seconds. Nevertheless, other formation techniques and processing conditions might be used to form the layer 610.

Figure 7:
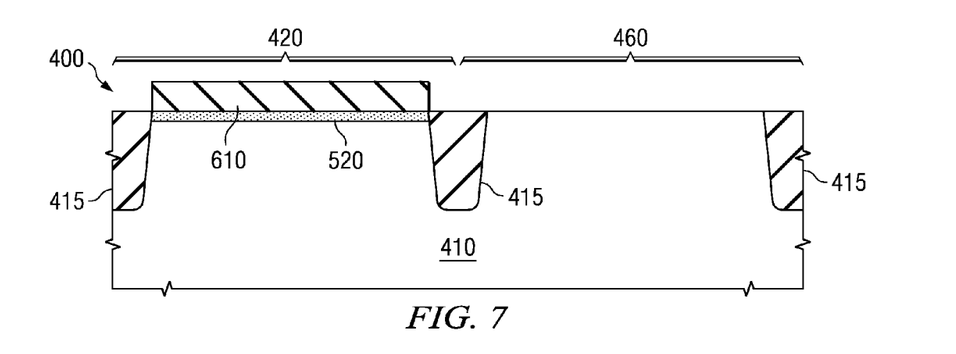

FIG. 7 illustrates the device 400 of FIG. 6 after removing the protective layer 470 to expose the lower voltage device region 460. In the example embodiment of FIG. 7, the protective layer 470 is removed by patterning photoresist over the high voltage device region 420 and then etching the protective layer 470 from the substrate 410 in the lower voltage device region 460. The photoresist would then be removed from the high voltage device region 420. Nevertheless, those skilled in the etching art would understand the specifics needed to appropriately remove the protective layer 470.

Figure 8:
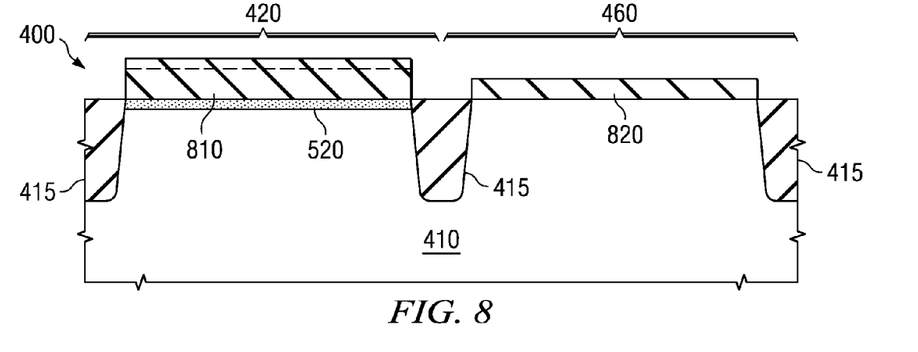

FIG. 8 illustrates the device 400 of FIG. 7 after forming a second dielectric material layer 820 over the substrate 410 in the lower voltage device region 460. In one embodiment, a wet chemical cleanup is performed on the substrate 410 prior to forming the layer 820. The wet chemical cleanup can include a silicon surface cleaning process, such as an RCA (Radio Corporation of America) clean and/or a SPM (sulfuric acid-hydrogen peroxide-water solution) clean. The RCA clean is the industry standard for removing contaminants from wafers. The RCA cleaning procedure generally has three major steps (e.g., organic clean, oxide strip and ionic clean) used sequentially. However, those skilled in the art would be familiar with a variety of different wet chemical cleanup procedures that could be employed to clean the substrate 410 prior to the formation of the layer 820.

The layer 820 may be formed using a variety of different processes. However, in the embodiment of FIG. 8 the layer 820 is formed using an oxidation process. The layer 820 may, in one embodiment, have a thickness of about 0.8 nm to about 1.4 nm, and be formed by a wet and/or dry thermal oxidation processing. It is to be appreciated that alternate methodologies can be employed to form the layer 820. For example, any technique suitably used to form the layer 610 might be used to form the layer 820.

In the example embodiment of FIG. 8, the high voltage device region 420 is subjected to the same oxidation process as the lower voltage device region 460. In this embodiment, a thickness of the layer 610 increases, ultimately becoming layer 810. As one would expect, the layer 810 is formed in part by the oxidation process associated with FIG. 6 and in part by the oxidation process associated with FIG. 8.

Figure 9:
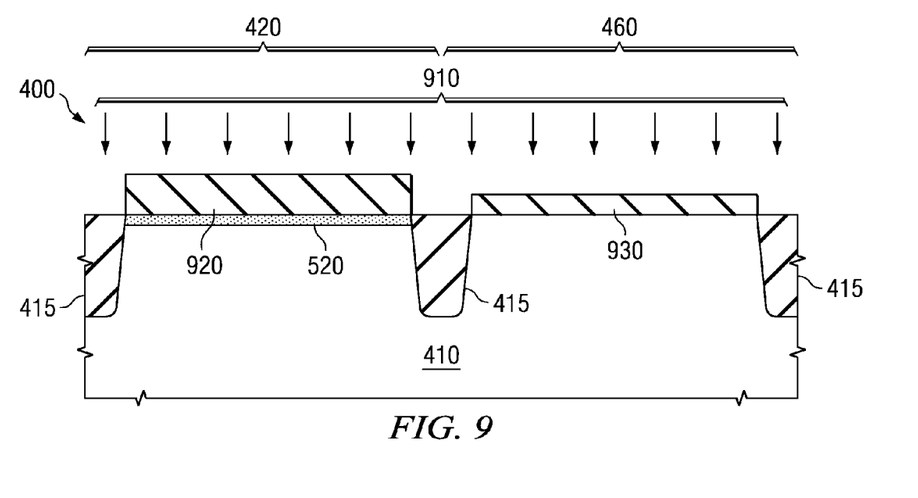

FIG. 9 illustrates the device 400 of FIG. 8 after subjecting the layer 810 and the layer 820 to a second plasma nitridation process 910. The process conditions for the second plasma nitridation process 910 may vary depending on a number of different criteria. However, in one example embodiment, the second plasma nitridation process 910 might use an effective RF power ranging from about 700 watts to about 1500 watts, a pressure ranging from about 10 mTorr to about 20 mTorr, a temperature ranging from about room temperature to about 400° C., and a gas flow of nitrogen ranging from about 100 sccm to about 500 sccm, for a period of about 10 seconds to about 60 seconds. Nevertheless, other processing conditions could also be used.

What results are a first nitrided dielectric material layer 920 in the high voltage device region 420 and a second nitrided dielectric material layer 930 in the lower voltage device region 460. Since the second nitridation process 910 is a relatively gentle plasma condition, it tends to incorporate nitrogen on the top surface of the first nitrided dielectric material layer 920. Nevertheless, it generally extends into a portion of the previous layer 520.

Accordingly, after the completion of the second nitrided dielectric material layer 930 (e.g., oxidation, radical nitridation, and post-radical treatment anneal thereof) the nitrogen concentration in the layer 520 approaches the nitrogen concentration in the layer 920. In the embodiment of FIG. 9 the first and second layers 920, 930 are silicon oxynitride dielectric layer. This, however, obviously depends on the material that the previous layers 810, 820 comprised prior to the second plasma nitridation process 910. As the layers 810, 820 may comprise different materials, the resulting layers 920, 930 may also.

Figure 10:
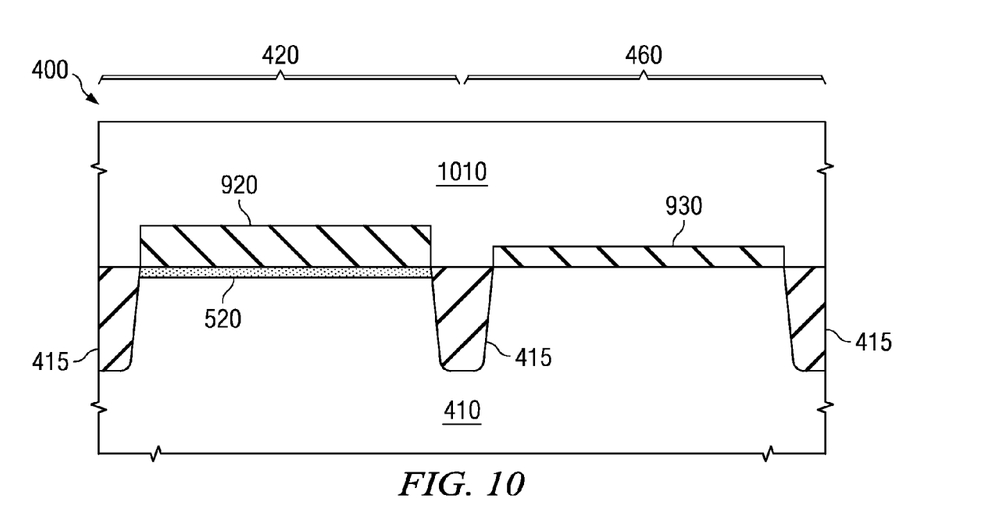

FIG. 10 illustrates the device 400 of FIG. 9 after forming a conformal (e.g., blanket) layer of gate electrode material 1010 over the first and second nitrided dielectric material layers 920, 930. The layer 1010 may, depending on its composition, be formed using any suitable technique. For example, among others, the layer 1010 may be formed using chemical vapor deposition (CVD) techniques, such as low pressure chemical vapor deposition (LPCVD) or plasma enhanced chemical vapor deposition (PECVD). In those embodiments wherein the layer 1010 comprises amorphous silicon, germanium, or silicon-germanium, standard deposition techniques may be employed. In those embodiments wherein the layer 1010 comprises a metal, standard sputtering techniques may be employed. The layer 1010, in one example embodiment, has a thickness ranging from about 80 nm to about 120 nm, but should not be limited to this thickness.

FIG. 11 illustrates the device 400 of FIG. 10 after patterning the layer of gate electrode material 1010 and first and second nitrided dielectric material layers 920, 930, resulting in a first gate structure 1110 located within the high voltage device region 420 and a second gate structure 1120 located within the lower voltage device region 460. As one would expect, the first gate structure 1110 includes a nitrogen region 1113, a first nitrided gate dielectric layer 1115 and a first gate electrode layer 1118. Additionally, the second gate structure 1120 includes a second nitrided gate dielectric layer 1123 and a second gate electrode layer 1128.

As is clearly illustrated, the first nitrided gate dielectric layer 1115 is thicker than the second nitrided gate dielectric layer 1123. Both the first and second nitrided gate dielectric layers 1115, 1123 may have improved nitrogen uniformities therein. Additionally, the average nitrogen concentrations in the first and second nitrided gate dielectric layers 1115, 1123 may vary from each other. After completing the device shown in FIG. 11, the manufacturing of the semiconductor device 400 would tend to continue in a standard manner, ultimately resulting in a device similar to that illustrated in FIG. 2.

Figure 12:
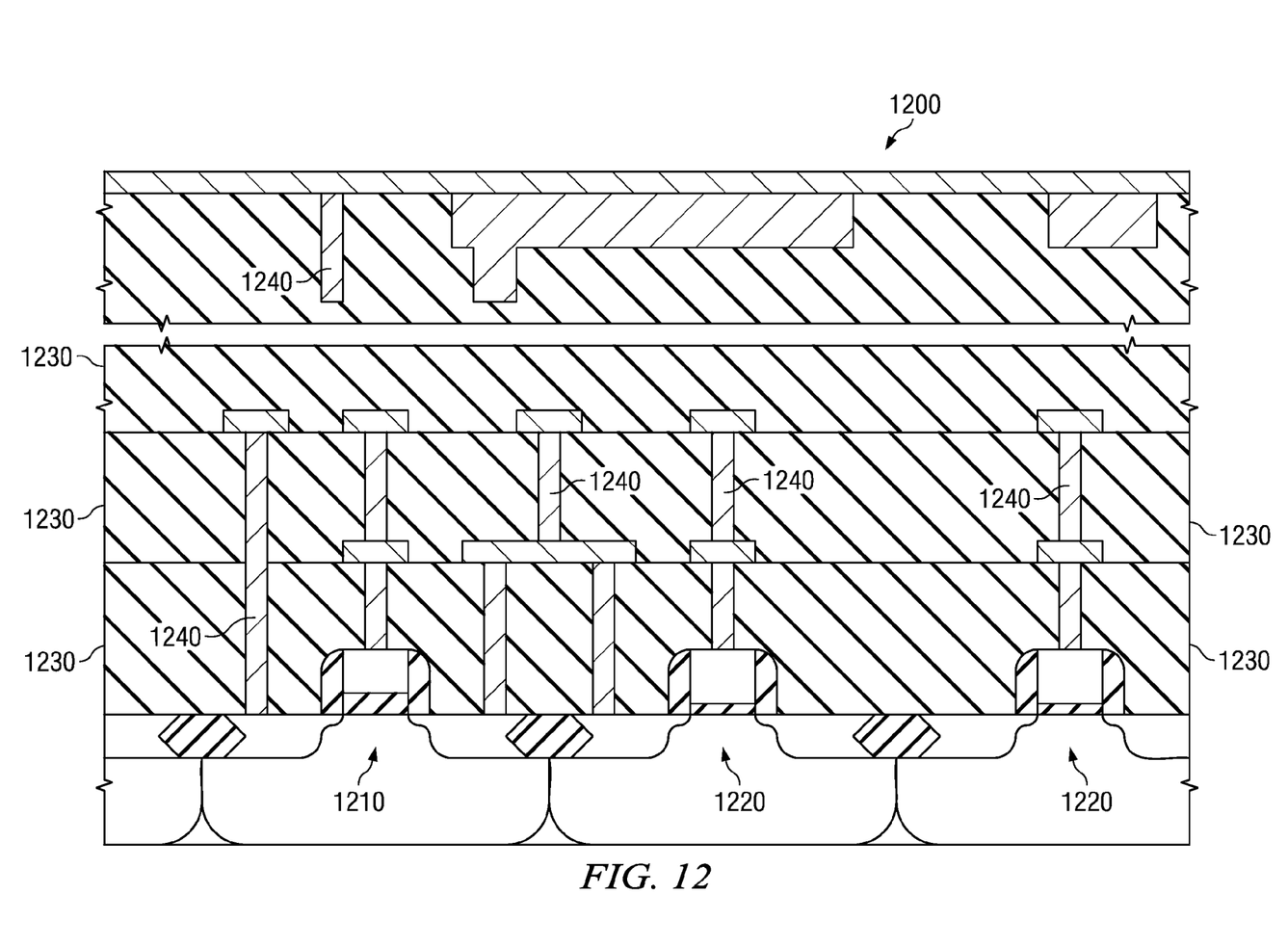
FIG. 12 illustrates an integrated circuit (IC) formed according to the disclosure.

FIG. 12 illustrates an integrated circuit (IC) 1200 incorporating a high voltage device region 1210 and a lower voltage device region 1220 formed according to the disclosure. The IC 1200 may include MOS, BiCMOS or bipolar components, and may further include passive components, such as capacitors, inductors or resistors. It may also include optical components or optoelectronic components. Those skilled in the art are familiar with these various types of components and their manufacture. The IC 1200 may also be a dual-voltage IC, comprising transistors operating with difference threshold voltages. The particular embodiment illustrated in FIG. 12 is a dual-voltage IC, as reflected by the high voltage device region 1210 and lower voltage device region 1220.

Dielectric layers 1230 may be fabricated over the high voltage device region 1210 and lower voltage device region 1220 using standard means. Additionally, interconnect structures 1240 are located within the dielectric layers 1230 to interconnect various components, thus forming the operational integrated circuit 1200. It will be apparent to one skilled in the art that several variations of the exemplary interconnect architecture may exist.

Those skilled in the art to which the disclosure relates will appreciate that other and further additions, deletions, substitutions and modifications may be made to the described embodiments without departing from the scope of the disclosure.

What is claimed is:

1. A method for manufacturing a semiconductor device including SiON gate dielectrics of different thicknesses, comprising:
    providing a substrate comprising silicon and a protective layer exposing a higher voltage device region of the substrate and covering a lower voltage device region of the substrate;
    with the protective layer covering the lower voltage device region, subjecting the exposed higher voltage device region to a first plasma nitridation to form a nitrogen region in the higher voltage device region;
    with the protective layer still covering the lower voltage device region, growing a first thickness of nitrided $SiO_2$ dielectric material on the exposed higher voltage device region by oxidizing silicon in the nitrogen region using at least one of $N_2O$ or NO gas;
    following growing the first thickness, removing the protective layer from the lower voltage device region;
    with the protective layer removed from the lower voltage device region, growing a second thickness of nitrided $SiO_2$ dielectric material on the first thickness on the exposed higher voltage device region and on the lower voltage device region; and
    following growing the second thickness, subjecting the dielectric material on the higher voltage device region and on the lower voltage device region to a second plasma nitridation;
    whereby a SiON gate dielectric with a substantially uniform nitrogen concentration throughout a bulk region of the combined first and second thicknesses is formed on the higher voltage device region.

2. The method of claim 1, further comprising performing an anneal following the second plasma nitridation.

3. The method of claim 1, wherein the first thickness is 1.5-3.5 nm and the second thickness is 0.8-1.4 nm.

4. The method of claim 1, wherein the first thickness is grown $N_2O$ gas at a pressure of 5-500 mTorr at a temperature of 1050-1150° C. for a duration of 30-90 seconds.

5. The method of claim 1, wherein the first plasma nitridation uses an RF power in the range of 500-1500 watts, a pressure in the range of 10-100 mTorr, a temperature in the range of room temperature –200° C., a nitrogen gas flow rate in the range of 50-500 sccm, and a duration in the range of 30-90 seconds.

6. The method of claim 5, wherein the second plasma nitridation uses an RF power in the range of 700-1500 watts, a pressure in the range of 10-20 mTorr, a temperature in the range of room temperature –400° C., a nitrogen gas flow rate in the range of 100-500 sccm, and a duration in the range of 10-60 seconds.

7. The method of claim 1, wherein the first plasma nitridation process uses a microwave power in the range of 1000-2000 watts, a pressure in the range of 50-200 mTorr, a temperature in the range of 200-500° C., a nitrogen gas flow rate in the range of 10-100 sccm, and a duration in the range of 30-90 seconds.

8. The method of claim 1, wherein the nitrogen region has an average nitrogen concentration of at least $1\times10^{16}$ atoms/$cm^3$.

9. The method of claim 8, wherein the nitrogen region has an average nitrogen concentration in the range of $2\times10^{16}$-$5\times10^{16}$ atoms/$cm^3$.

10. The method of claim 1, wherein an end thickness of the dielectric material on the higher voltage device region is about 2.3 nm or greater, and an end thickness of the dielectric material on the lower voltage device region is about 1.4 nm or less.

11. The method of claim 10, wherein the end thickness of the dielectric material on the higher voltage device region is 2.3-4.9 nm, and the end thickness of the dielectric material on the lower voltage device region is 0.8-1.4 nm.

12. The method of claim 1, wherein a non-uniformity of the nitrogen concentration in a bulk region of the combined first and second thicknesses is less than about 20%, where % non-uniformity is defined by:

$$\% N.U. = \frac{[N]_{max} - [N]_{min}}{[N]_{avg}} * 100,$$

and the bulk region extends from a depth of about 0.3 nm from an upper surface to a depth at which an oxygen profile decreases to about 50% of an average concentration.

* * * * *